US008361906B2

(12) United States Patent
Lee et al.

(10) Patent No.: US 8,361,906 B2
(45) Date of Patent: Jan. 29, 2013

(54) ULTRA HIGH SELECTIVITY ASHABLE HARD MASK FILM

(75) Inventors: Kwangduk Douglas Lee, Redwood City, CA (US); Martin Jay Seamons, San Jose, CA (US); Sudha Rathi, San Jose, CA (US); Chiu Chan, Foster City, CA (US); Michael H. Lin, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 196 days.

(21) Appl. No.: 12/784,341

(22) Filed: May 20, 2010

(65) Prior Publication Data

US 2011/0287633 A1 Nov. 24, 2011

(51) Int. Cl.
*H01L 21/302* (2006.01)
(52) U.S. Cl. ......... 438/725; 438/714; 438/717; 430/313
(58) Field of Classification Search ............ 438/706, 438/712, 714, 723, 735, 758, 759, 717, 725, 438/740; 430/311, 314, 313
See application file for complete search history.

(56) References Cited

U.S. PATENT DOCUMENTS

| | | | |
|---|---|---|---|
| 4,719,968 A * | 1/1988 | Speros | 165/154 |
| 6,428,894 B1 | 8/2002 | Babich et al. | |
| 6,573,030 B1 * | 6/2003 | Fairbairn et al. | 430/323 |
| 7,037,830 B1 * | 5/2006 | Rumer et al. | 438/656 |
| 7,332,262 B2 * | 2/2008 | Latchford et al. | 430/311 |
| 7,867,578 B2 | 1/2011 | Padhi et al. | |
| 2003/0091938 A1 | 5/2003 | Fairbairn et al. | |
| 2005/0059262 A1 | 3/2005 | Yin et al. | |
| 2005/0101154 A1 | 5/2005 | Huang | |
| 2005/0142361 A1 | 6/2005 | Nakanishi et al. | |
| 2005/0199013 A1 | 9/2005 | Vandroux et al. | |
| 2005/0287771 A1 | 12/2005 | Seamons et al. | |
| 2006/0014397 A1 | 1/2006 | Seamons et al. | |
| 2007/0286954 A1 | 12/2007 | Tang et al. | |
| 2008/0003824 A1 | 1/2008 | Padhi et al. | |
| 2008/0153311 A1 | 6/2008 | Padhi et al. | |
| 2008/0254233 A1 * | 10/2008 | Lee et al. | 427/595 |
| 2009/0017587 A1 * | 1/2009 | Grudowski et al. | 438/199 |
| 2009/0093128 A1 | 4/2009 | Seamons et al. | |
| 2010/0093187 A1 | 4/2010 | Lee et al. | |

OTHER PUBLICATIONS

Notice of Final Rejection for Korean Patent Application No. 10-2007-0064292 dated Dec. 31, 2009.
Notice to File a Response for Korean Patent Application No. 10-2007-0064292 dated Apr. 17, 2009.
Notice to File a Response for Korean Patent Application No. 10-2007-0064292 dated Sep. 26, 2008.
PCT Search Report and Written Opinion for International Application No. PCT/US2009/035726 dated Aug. 25, 2009.
PCT Search Report and Written Opinion for International Application No. PCT/US2009/035726 dated Jun. 12, 2008.

(Continued)

*Primary Examiner* — Lan Vinh
(74) *Attorney, Agent, or Firm* — Patterson & Sheridan, LLP

(57) ABSTRACT

A method of forming an amorphous carbon layer on a substrate in a substrate processing chamber, includes introducing a hydrocarbon source into the processing chamber, introducing argon, alone or in combination with helium, hydrogen, nitrogen, and combinations thereof, into the processing chamber, wherein the argon has a volumetric flow rate to hydrocarbon source volumetric flow rate ratio of about 10:1 to about 20:1, generating a plasma in the processing chamber at a substantially lower pressure of about 2 Torr to 10 Torr, and forming a conformal amorphous carbon layer on the substrate.

13 Claims, 3 Drawing Sheets

OTHER PUBLICATIONS

International Search Report and Written Opinion dated Jan. 9, 2012 for International Application No. PCT/US2011/034185.

* cited by examiner

ULTRA HIGH SELECTIVITY ASHABLE HARD MASK FILM

BACKGROUND OF THE INVENTION

1. Field of the Invention

Embodiments of the present invention generally relate to the fabrication of integrated circuits and particularly to the deposition of an amorphous carbon layer with high film density and high etch selectivity.

2. Description of the Related Art

Integrated circuits have evolved into complex devices that can include millions of transistors, capacitors and resistors on a single chip. The evolution of chip design continually requires faster circuitry and greater circuit density. The demand for faster circuits with greater circuit densities imposes corresponding demands on the materials used to fabricate such integrated circuits. In particular, as the dimensions of integrated circuit components are reduced to sub-micron dimensions, it has been necessary to use not only low resistivity conductive materials such as copper to improve the electrical performance of devices, but also low dielectric constant insulating materials, often referred to as low-k materials. Low-k materials generally have a dielectric constant of less than 4.0.

Producing devices having low-k materials with little or no surface defects or feature deformation is problematic. Low-k dielectric materials are often porous and susceptible to being scratched or damaged during subsequent process steps, thus increasing the likelihood of defects being formed on the substrate surface. Low-k materials are often brittle and may deform under conventional polishing processes, such as chemical mechanical polishing (CMP). One solution to limiting or reducing surface defects and deformation of low-k materials is the deposition of a hardmask (e.g., TiN hardmask) over the exposed low-k materials prior to patterning and etching. The hardmask prevents damage and deformation of the delicate low-k materials. In addition, a hardmask layer may act as an etch mask in conjunction with conventional lithographic techniques to prevent the removal of a low-k material during etch.

Typically, the hardmask is an intermediate oxide layer, e.g., silicon dioxide or silicon nitride. However, some device structures already include silicon dioxide and/or silicon nitride layers, for example, damascene structures. Such device structures, therefore, cannot be patterned using a silicon dioxide or silicon nitride hardmask as an etch mask, since there will be little or no etch selectivity between the hardmask and the material thereunder, i.e., removal of the hardmask will result in unacceptable damage to underlying layers. To act as an etch mask for oxide layers, such as silicon dioxide or silicon nitride, a material must have good etch selectivity relative to those oxide layers.

Amorphous hydrogenated carbon, also referred to as amorphous carbon and denoted a-C:H, has been proved to be an effective material serving as a hardmask for oxide, nitride, poly-Si, or metal (e.g., Al) materials. Amorphous hydrogenated carbon is essentially a carbon material with no long-range crystalline order which may contain a substantial hydrogen content, for example on the order of about 10 to 45 atomic %. a-C:H is used as hardmask material in semiconductor applications because of its chemical inertness, optical transparency, and good mechanical properties. While a-C:H films can be deposited via various techniques, plasma enhanced chemical vapor deposition (PECVD) is widely used due to cost efficiency and film property tunability.

To ensure that the desired amorphous carbon film adequately protects underlying material layer during dry etching, it is important that amorphous carbon film possesses a relatively high etch selectivity, or removal rate ratio, with respect to material layer thereunder. Generally, an etch selectivity during the dry etch process of at least about 3:1 or more, such as 10:1, is desirable between amorphous carbon film and material layer, i.e., material layer is etched ten times faster than amorphous carbon film. In this way, the hardmask film formed by amorphous carbon protects regions of underlying material layer that are not to be etched or damaged while apertures are formed therein via a dry etch process.

The etch selectivity has been known can be increased with a higher film density. For amorphous carbon hardmask, however, there is typically a trade-off between high film density and hardmask ashability. It is therefore a need for an amorphous carbon hardmask which has higher film density (and therefore etch selectivity) while maintaining a decent ashability for hardmasks.

SUMMARY OF THE INVENTION

Embodiments of the present invention provide a method for depositing an amorphous carbon layer on a substrate in a substrate processing chamber. In one embodiment, the method includes introducing a hydrocarbon source into the processing chamber, introducing a plasma-initiating gas selected from the group consisting of helium, hydrogen, argon, nitrogen, and combinations thereof into the processing chamber, introducing a diluent gas consisting of argon into the processing chamber, wherein the argon has a volumetric flow rate to hydrocarbon source volumetric flow rate ratio of about 20:1 or greater, generating a plasma in the processing chamber at a substantially lower pressure of about 1 Torr to 10 Torr, and forming a conformal amorphous carbon layer on the substrate. In one aspect, an additional diluent gas consisting of hydrogen is introduced into the processing chamber to increase film density of the amorphous carbon layer up to 1.9 g/cc.

Embodiments of the present invention also provide a method for forming a semiconductor device in a processing chamber. In one embodiment, the method includes forming an amorphous carbon layer on a substrate by introducing a gas mixture into the processing chamber, wherein the gas mixture comprises a hydrocarbon source, a plasma-initiating gas, and a diluent gas consisting of argon and hydrogen into the processing chamber, wherein the argon and hydrogen have a volumetric flow rate to hydrocarbon source volumetric flow rate ratio of about 20:1.4:1, generating a plasma in the processing chamber to decompose the hydrocarbon source in the gas mixture to form the amorphous carbon layer on the substrate, defining a pattern in at least one region of the amorphous carbon layer, and transferring the pattern defined in the at least one region of the amorphous carbon layer into the substrate using the amorphous carbon layer as a mask.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally provide a method for forming a hard mask with high film density, high etch selectivity, and decent ashability, while still maintaining a superior line integrity for sub 45 nm devices. High etch selectivity enables a thinner hardmask which improves etch margin and allows for controllable etch of smaller features without having conventional issues associated with line wiggling and line bending.

Exemplary Hardware

Figure 1:
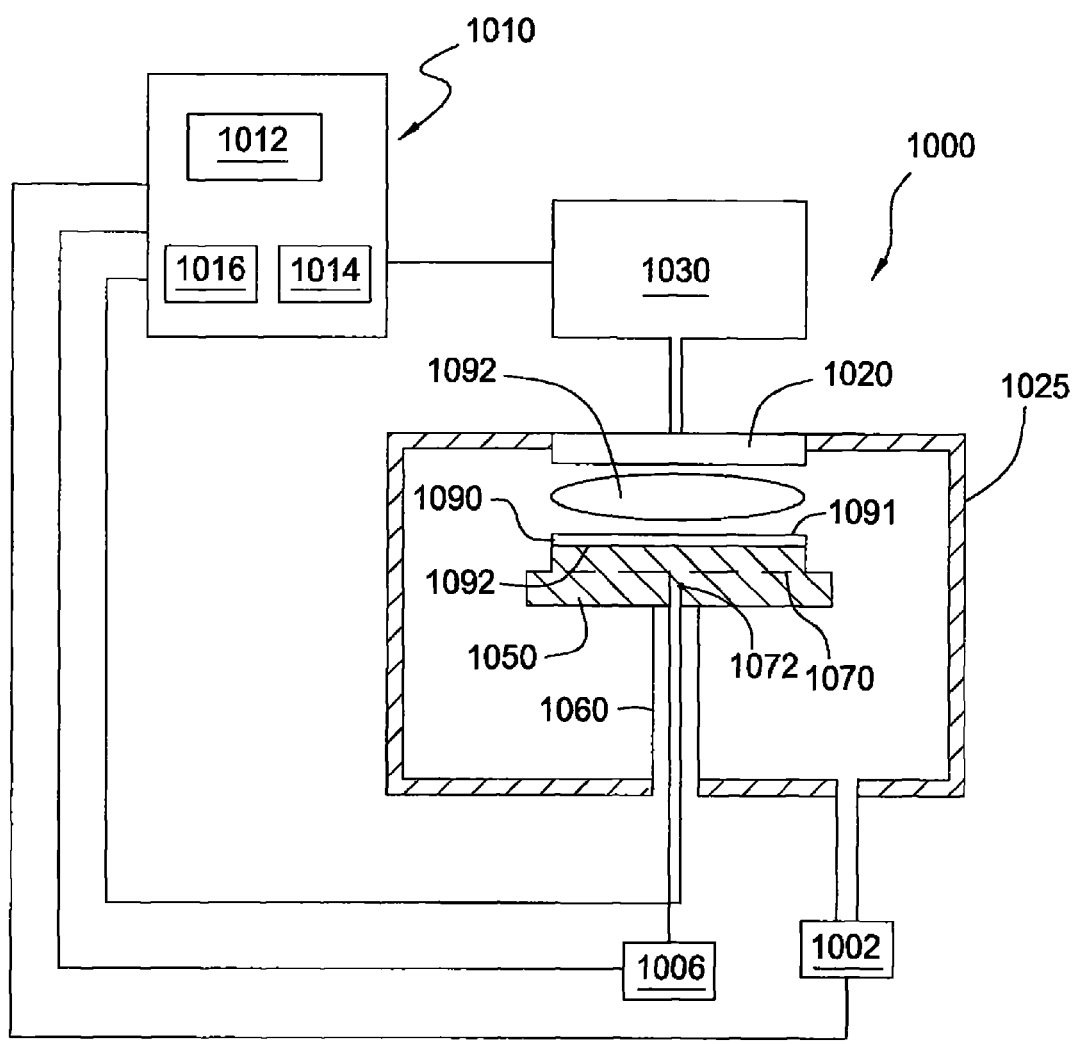
FIG. 1 is a schematic representation of a substrate processing system that can be used to perform amorphous carbon layer deposition according to embodiments of the invention.

FIG. 1 is a schematic representation of a substrate processing system, system 1000, which can be used for features and/or amorphous carbon layer deposition according to embodiments of the present invention. Examples of suitable systems include the CENTURA® systems which may use a DxZ™ processing chamber, PRECISION 5000® systems, PRODUCER™ systems, such as the PRODUCER SE™ processing chamber and the PRODUCER GT™ processing chamber, all of which are commercially available from Applied Materials, Inc., Santa Clara, Calif.

System 1000 includes a process chamber 1025, a gas panel 1030, a control unit 1010, and other hardware components such as power supplies and vacuum pumps. Details of one embodiment of the system used in the present invention are described in a commonly assigned U.S. patent "High Temperature Chemical Vapor Deposition Chamber", U.S. Pat. No. 6,364,954, issued on Apr. 2, 2002, which is hereby incorporated by reference herein.

The process chamber 1025 generally comprises a support pedestal 1050, which is used to support a substrate such as a semiconductor substrate 1090. This pedestal 1050 moves in a vertical direction inside the process chamber 1025 using a displacement mechanism (not shown) coupled to shaft 1060. Depending on the process, the substrate 1090 can be heated to a desired temperature prior to processing. The substrate support pedestal 1050 is heated by an embedded heater element 1070. For example, the pedestal 1050 may be resistively heated by applying an electric current from an AC power supply 1006 to the heater element 1070. The substrate 1090 is, in turn, heated by the pedestal 1050. A temperature sensor 1072, such as a thermocouple, is also embedded in the substrate support pedestal 1050 to monitor the temperature of the pedestal 1050. The measured temperature is used in a feedback loop to control the AC power supply 1006 for the heater element 1070. The substrate temperature can be maintained or controlled at a temperature that is selected for the particular process application.

A vacuum pump 1002 is used to evacuate the process chamber 1025 and to maintain the proper gas flows and pressure inside the process chamber 1025. A showerhead 1020, through which process gases are introduced into process chamber 1025, is located above the substrate support pedestal 1050 and is adapted to provide a uniform distribution of process gases into process chamber 1025. The showerhead 1020 is connected to a gas panel 1030, which controls and supplies the various process gases used in different steps of the process sequence. Process gases may include a hydrocarbon source and a plasma-initiating gas and are described in more detail below in conjunction with a description of an exemplary argon-diluted deposition process.

The gas panel 1030 may also be used to control and supply various vaporized liquid precursors. While not shown, liquid precursors from a liquid precursor supply may be vaporized, for example, by a liquid injection vaporizer, and delivered to process chamber 1025 in the presence of a carrier gas. The carrier gas is typically an inert gas, such as nitrogen, or a noble gas, such as argon or helium. Alternatively, the liquid precursor may be vaporized from an ampoule by a thermal and/or vacuum enhanced vaporization process.

The showerhead 1020 and substrate support pedestal 1050 may also form a pair of spaced electrodes. When an electric field is generated between these electrodes, the process gases introduced into chamber 1025 are ignited into a plasma 1092. Typically, the electric field is generated by connecting the substrate support pedestal 1050 to a source of single-frequency or dual-frequency radio frequency (RF) power (not shown) through a matching network (not shown). Alternatively, the RF power source and matching network may be coupled to the showerhead 1020, or coupled to both the showerhead 1020 and the substrate support pedestal 1050.

PECVD techniques promote excitation and/or disassociation of the reactant gases by the application of the electric field to the reaction zone near the substrate surface, creating a plasma of reactive species. The reactivity of the species in the plasma reduces the energy required for a chemical reaction to take place, in effect lowering the required temperature for such PECVD processes.

Proper control and regulation of the gas and liquid flows through the gas panel 1030 is performed by mass flow controllers (not shown) and a control unit 1010 such as a computer. The showerhead 1020 allows process gases from the gas panel 1030 to be uniformly distributed and introduced into the process chamber 1025. Illustratively, the control unit 1010 comprises a central processing unit (CPU) 1012, support circuitry 1014, and memories containing associated control software 1016. This control unit 1010 is responsible for automated control of the numerous steps required for substrate processing, such as substrate transport, gas flow control, liquid flow control, temperature control, chamber evacuation, and so on. When the process gas mixture exits the showerhead 1020, plasma enhanced thermal decomposition of the hydrocarbon compound occurs at the surface 1091 of the heated substrate 1090, resulting in the deposition of an amorphous carbon layer on the substrate 1090.

Exemplary Fabrication Sequence Incorporating a-C Layer as Hardmask

Figure 2A:
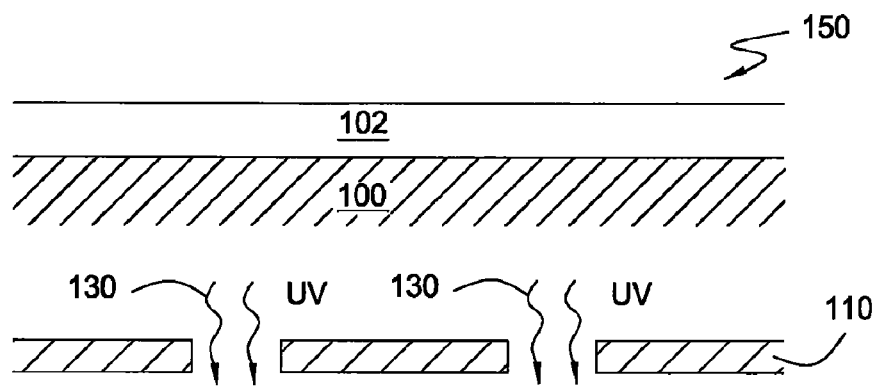
FIGS. 2A-2E (Prior Art) illustrate schematic cross-sectional views of a substrate at different stages of an integrated circuit fabrication sequence incorporating an amorphous carbon layer as a hardmask.

FIGS. 2A-2E illustrate schematic cross-sectional views of a substrate 100 at different stages of an integrated circuit fabrication sequence incorporating an a-C:H layer as a hardmask. A substrate structure 150 denotes the substrate 100 together with other material layers formed on the substrate 100. FIG. 2A illustrates a cross-sectional view of a substrate structure 150 having a material layer 102 that has been conventionally formed thereon. The material layer 102 may be a low-k material and/or an oxide, e.g., $SiO_2$.

Figure 2B:
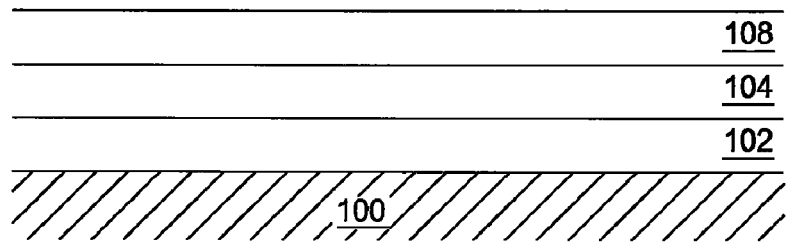

FIG. 2B depicts an amorphous carbon layer 104 deposited on the substrate structure 150 of FIG. 2A. The amorphous carbon layer 104 is formed on the substrate structure 150 by conventional means, such as via PECVD. The thickness of amorphous carbon layer 104 is variable depending on the specific stage of processing. Typically, amorphous carbon layer 104 has a thickness in the range of about 500 Å to about 10000 Å. Depending on the etch chemistry of the energy sensitive resist material 108 used in the fabrication sequence, an optional capping layer (not shown) may be formed on amorphous carbon layer 104 prior to the formation of energy sensitive resist material 108. The optional capping layer functions as a mask for the amorphous carbon layer 104 when the pattern is transferred therein and protects amorphous carbon layer 104 from energy sensitive resist material 108.

As depicted in FIG. 2B, energy sensitive resist material 108 is formed on amorphous carbon layer 104. The layer of energy sensitive resist material 108 can be spin-coated on the substrate to a thickness within the range of about 2000 Å to about 6000 Å. Most energy sensitive resist materials are sensitive to ultraviolet (UV) radiation having a wavelength less than about 450 nm, and for some applications having wavelengths of 245 nm or 193 nm.

Figure 2C:
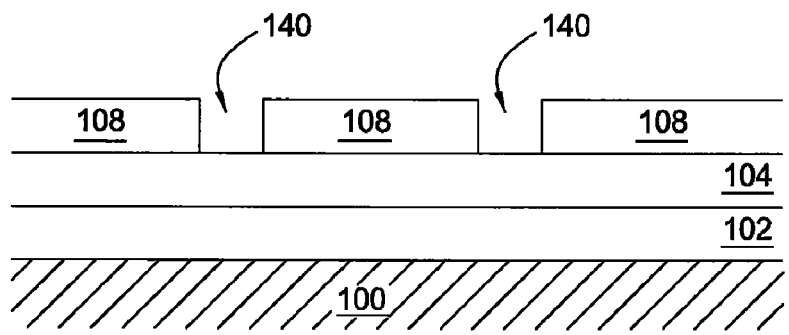

A pattern is introduced into the layer of energy sensitive resist material 108 by exposing energy sensitive resist material 108 to UV radiation 130 through a patterning device, such as a mask 110, and subsequently developing energy sensitive resist material 108 in an appropriate developer. After energy sensitive resist material 108 has been developed, the desired pattern, consisting of openings 140, is present in energy sensitive resist material 108, as shown in FIG. 2C.

Figure 2D:
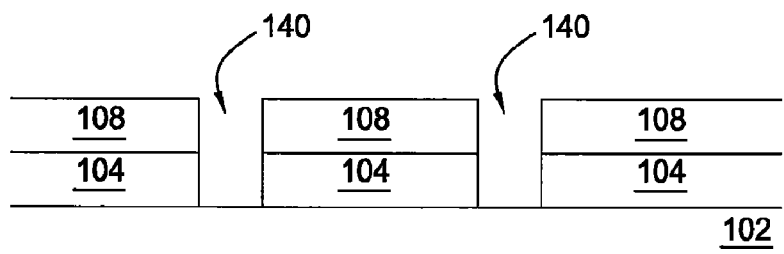

Thereafter, referring to FIG. 2D, the pattern defined in energy sensitive resist material 108 is transferred through amorphous carbon layer 104 using the energy sensitive resist material 108 as a mask. An appropriate chemical etchant is used that selectively etches amorphous carbon layer 104 over the energy sensitive resist material 108 and the material layer 102, extending openings 140 to the surface of material layer 102. Appropriate chemical etchants include ozone, oxygen or ammonia plasmas.

Figure 2E:
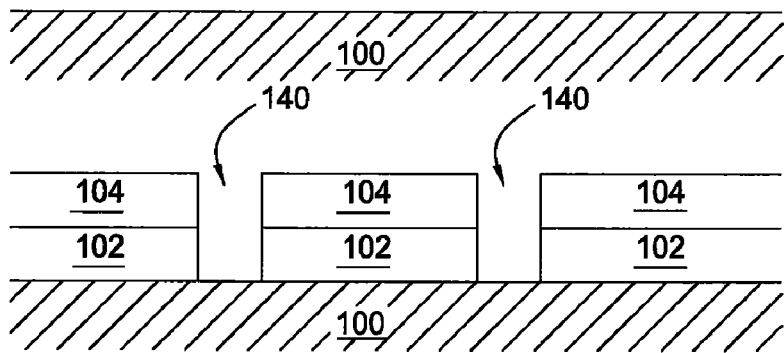

Referring to FIG. 2E, the pattern is then transferred through material layer 102 using the amorphous carbon layer 104 as a hardmask. In this process step, an etchant is used that selectively removes material layer 102 over amorphous carbon layer 104, such as a dry etch, i.e. a non-reactive plasma etch. After the material layer 102 is patterned, the amorphous carbon layer 104 can optionally be stripped from the substrate 100. In a specific example of a fabrication sequence, the pattern defined in the a-C:H hardmask is incorporated into the structure of the integrated circuit, such as a damascene structure that is typically used to form metal interconnects on integrated circuits.

Deposition Process

As stated previously, amorphous hydrogenated carbon is a material that may be used as an etch hardmask in semiconductor applications due to its high chemical inertness, optical transparency, and easy removal. It has been known that a desired etch selectivity for an a-C:H film may be achieved by increasing the film density. Aspects of the invention described below have been proved by the present inventors to be able to create an a-C:H film with high film density and therefore higher etch selectivity, while still maintaining an effective ashability for hardmasks. High etch selectivity enables an even thinner hardmask which improves etch margin and allows for controllable etch of smaller features, thereby obtaining a superior line integrity for devices under sub 45 nm without having conventional issues associated with line wiggling and line bending.

In one aspect of the deposition process in accordance with the present invention, an a-C:H film is formed by introducing a hydrocarbon source, a plasma-initiating gas, and a diluent gas into a processing chamber, such as process chamber 1025 described above in conjunction with FIG. 1. Plasma is then initiated in the chamber to create excited CH— radicals. The excited CH— radicals are chemically bound to the surface of a substrate positioned in the chamber, forming the desired a-C:H film thereon. The hydrocarbon source may be a mixture of one or more hydrocarbon compounds. The hydrocarbon source may include a gas-phase hydrocarbon compound and/or a gas mixture including vapors of a liquid-phase hydrocarbon compound and a carrier gas. In one embodiment, the hydrocarbon compound is $C_2H_2$. However, other hydrocarbon compounds may be used depending on the desired film, including one or more vaporized liquid-phase hydrocarbon compounds entrained in a carrier gas. The plasma-initiating gas may be helium since it is easily ionized; however, other gases, such as argon, may also be used. The diluent gas may be an easily ionized, relatively massive, and chemically inert gas such as argon, krypton, xenon. In one embodiment of the present invention, additional hydrogen dilution can be introduced to further increase the film density, as will be discussed later.

Amorphous carbon films formed using partially or completely doped derivatives of hydrocarbon compounds may also benefit from the inventive method. Derivatives include nitrogen-, fluorine-, oxygen-, hydroxyl group-, and boron-containing derivatives of hydrocarbon compounds. The hydrocarbon compounds may contain nitrogen or be deposited with a nitrogen-containing gas, such as ammonia, or the hydrocarbon compounds may have substituents such as fluorine and oxygen. Any of these processes may benefit from the density, deposition rate and conformality improvements demonstrated for undoped a-C:H films deposited with the inventive method. A more detailed description of hydrocarbon compounds or doped derivatives thereof that may be used in processes benefiting from aspects of the invention may be found in commonly assigned U.S. Pat. No. 7,407,893 entitled "Liquid Precursors for the CVD deposition of Amorphous Carbon Films," filed on Feb. 24, 2005, and commonly assigned United States Patent Pub. No. 2010/0093187 entitled "Method for Depositing Conformal Amorphous Carbon Film by Plasma-Enhanced Chemical Vapor Deposition (PECVD)", which are hereby incorporated by reference in their entirety to the extent not inconsistent with the claimed invention.

Generally, hydrocarbon compounds or derivatives thereof that may be included in the hydrocarbon source may be described by the formula $C_xH_y$, where x has a range of between 1 and 20, and y has a range of between 1 and 20. In another embodiment, the hydrocarbon compounds or derivatives thereof that may be included in the hydrocarbon source may be described by the formula $C_xH_yF_z$, where x has a range of between 1 and 24, y has a range of between 0 and 50, and z has a range of 0 to 50, and the ratio of x to y+c is 1:2 or greater. In yet another embodiment, the hydrocarbon source may be described by the formula $C_aH_bO_cF_dN_e$ for oxygen and/or nitrogen substituted compounds, where a has a range of between 1 and 24, b has a range of between 0 and 50, c has a range of 0 to 10, d has a range of 0 to 50, e has a range of 0 to 10, and the ratio of a to b+c+d+e is 1:2 or greater.

Suitable hydrocarbon compounds include one or more of the following compounds, for example, alkanes methane ($CH_4$), ethane ($C_2H_6$), propane ($C_3H_8$), butane ($C_4H_{10}$) and its isomer isobutane, pentane ($C_5H_{12}$) and its isomers isopentane and neopentane, hexane ($C_6H_{14}$) and its isomers 2-methylpentane, 3-methylpentane, 2,3-dimethylbutane, and 2,2-dimethyl butane, and so on. Additional suitable hydrocarbons may include alkenes such as ethylene, propylene, butylene and its isomers, pentene and its isomers, and the like, dienes such as butadiene, isoprene, pentadiene, hexadiene and the like, and halogenated alkenes include monofluoroethylene, difluoroethylenes, trifluoroethylene, tetrafluoroethylene, monochloroethylene, dichloroethylenes, trichloroethylene, tetrachloroethylene, and the like. Also, alkynes such as acetylene ($C_2H_2$), propyne ($C_3H_4$), butylene ($C_4H_8$), vinylacetylene and derivatives thereof can be used as carbon precursors. Additionally aromatic hydrocarbons, such as benzene, styrene, toluene, xylene, ethylbenzene, acetophenone, methyl benzoate, phenyl acetate, phenol, cresol, furan, and the like, alpha-terpinene, cymene, 1,1,3,3,-tetramethylbutylbenzene, t-butylether, t-butylethylene, methyl-methacrylate, and t-butylfurfurylether, compounds having the formula $C_3H_2$ and $C_5H_4$, halogenated aromatic compounds including monofluorobenzene, difluorobenzenes, tetrafluorobenzenes, hexafluorobenzene and the like can be used.

Examples of suitable derivatives of hydrocarbon compounds may include, but not limited to fluorinated alkanes, halogenated alkanes, and halogenated aromatic compounds. Fluorinated alkanes may include, but not limited to monofluoromethane, difluoromethane, trifluoromethane, tetrafluoromethane, monofluoroethane, tetrafluoroethanes, pentafluoroethane, hexafluoroethane, monofluoropropanes, trifluoropropanes, pentafluoropropanes, perfluoropropane, monofluorobutanes, trifluorobutanes, tetrafluorobutanes, octafluorobutanes, difluorobutanes, monofluoropentanes, pentafluoropentanes, tetrafluorohexanes, tetrafluoroheptanes, hexafluoroheptanes, difluorooctanes, pentafluorooctanes, difluorotetrafluorooctanes, monofluorononanes, hexafluorononanes, difluorodecanes, pentafluorodecanes, and the like. Halogenated alkenes may include, but not limited to monofluoroethylene, difluoroethylenes, trifluoroethylene, tetrafluoroethylene, monochloroethylene, dichloroethylenes, trichloroethylene, tetrachloroethylene, and the like. Halogenated aromatic compounds may include, but not limited to monofluorobenzene, difluorobenzenes, tetrafluorobenzenes, hexafluorobenzene and the like. The a-C:H film as described throughout the present specification may be an Advanced Patterning Film™ (APF) material commercially available from Applied Materials, Inc. of Santa Clara, Calif.

The a-C:H film may be deposited from the processing gas by maintaining a substrate temperature between about 0° C. and about 800° C., such as at a temperature from about 100° C. to about 650° C., for example, from about 200° C. to about 480° C. in order to minimize the coefficient of absorption of the resultant film. The process chamber is maintained at a mild vacuum of about 1 mTorr to about 5 mTorr when not running process. The a-C:H film may be deposited from the processing gas by maintaining a chamber pressure about 1 Torr to about 5 Torr, or greater, such as from about 2 Torr to about 10 Torr, or greater, such as about 20 Torr. In one embodiment, the chamber pressure is maintained about 7 Torr or greater, for example, from about 8 Torr to about 9 Torr.

The hydrocarbon source, a plasma-initiating gas, and a diluent gas are introduced into the chamber and plasma is initiated to begin deposition. Preferably, the plasma-initiating gas is helium or another easily ionized gas and is introduced into the chamber before the hydrocarbon source and the diluent gas, which allows a stable plasma to be formed and reduces the chances of arcing. In one embodiment, the hydrocarbon source is acetylene ($C_2H_2$) due to formation of more stable intermediate species which allows more surface mobility, although, as described above, other hydrocarbon compounds may be used depending on the desired film, including one or more vaporized liquid-phase hydrocarbon compounds entrained in a carrier gas. The diluent gas may be any noble gas at least as massive as argon, krypton, or xenon, however argon is preferred for reasons of economy. Gases having atomic weight lighter than that of argon are often considered not preferable due to their inability to achieve the beneficial deposition rate and film density. However, the present inventor has surprisingly and unexpectedly discovered that an additional hydrogen dilution can also increase film density up to 1.98 g/cc with −1000 Mpa stress, which is almost 50%-80% higher density than existing ashable hardmasks best available currently, as will be discussed in detail below.

A dual-frequency RF system may be used to generate the plasma. A dual frequency RF power application is believed to provide independent control of flux and ion energy, since it is believed that the energy of the ions hitting the film surface influences the film density. It is believed that the high frequency plasma controls plasma density and a low frequency plasma controls kinetic energy of the ions hitting the substrate surface. A dual-frequency source of mixed RF power provides a high frequency power in a range from about 10 MHz to about 30 MHz, for example, about 13.56 MHz, as well as a low frequency power in a range of from about 10 KHz to about 1 MHz, for example, about 350 KHz. When a dual frequency RF system is used to deposit the a-C:H film, the ratio of the second RF power to the total mixed frequency power may be less than about 0.6 to 1.0 (0.6:1). The applied RF power and use of one or more frequencies may be varied based upon the substrate size and the equipment used. If desired, a single frequency RF power application may be used, and is typically, an application of the high frequency power as described herein.

Plasma may be generated by applying RF power at a power density to substrate surface area of from about 0.01 W/cm² to about 5 W/cm², such as from about 0.01 to about 1 W/cm². In one embodiment, the single frequency RF power used for deposition of a-C:H film is between about 500 Watts and about 3000 Watts, for example, 1400 Watts. Electrode spacing, i.e., the distance between the substrate and the showerhead, may be from about 200 mils to about 1000 mils, for example, from about 280 mils to about 300 mils spacing.

In order to maximize the benefits of the argon and hydrogen dilution deposition method, it is important that a large quantity of diluent is introduced into the PECVD chamber relative to the quantity of hydrocarbon compounds. However, it is equally important that diluent is not introduced into the chamber at a flow rate that is too high. Higher density a-C:H layers may be formed with increasing diluent flow rates, producing even higher etch selectivity for the a-C:H film, but higher density also leads to higher film stress. Very high film stress in the a-C:H film causes serious problems such as poor adhesion of the a-C:H film to substrate surfaces and/or cracking of the a-C:H film. Therefore, the addition of argon and hydrogen beyond a certain molar ratio relative to the hydrocarbon compound will deleteriously affect the properties of the film. Hence, there is a process window, wherein the ratio of molar flow rate of diluenting gases to the molar flow rate of hydrocarbon compound into the PECVD chamber is maintained between about 2:1 and about 40:1, depending on the desired properties of the deposited film.

An exemplary deposition process for processing 300 mm circular substrates employs helium as the plasma-initiating gas, $C_2H_2$ or $C_3H_6$ as the hydrocarbon source, and argon and hydrogen as the diluent gases. The exemplary flow rate of helium is between about 200 sccm and about 1000 sccm, the flow rate of $C_2H_2$ or $C_3H_6$ is between about 200 sccm and 1000 sccm, the flow rate of argon is between about 1000 sccm and about 20000 sccm, and flow rate of hydrogen is between about 500 sccm and about 5000 sccm. In one example, the flow rate of argon is between about 10000 sccm to about 14000 sccm and the flow rate of hydrogen is between about 800 sccm to about 1000 sccm. Single frequency RF power is between about 800 W and about 1600 W. Intensive parameters for this process, i.e., chamber pressure, substrate temperature, etc., are as described above. These process parameters provide a deposition rate for an a-C:H layer in the range of about 900 Å/min to about 1200 Å/min, with a density of about 1.90 g/cc, and an absorption coefficient of about 0.58 for 633 nm radiation. In one embodiment, the molar flow rate of hydrocarbon source and argon is in a ratio of about 1:10 or greater, for example, about 1:20. In one embodiment, the molar flow rate of the acetylene ($C_2H_2$), the helium gas, the argon gas, and the hydrogen gas is in a ratio of 1:0.5:20:1.4, respectively. It is contemplated that those skilled in the art, upon reading the disclosure herein, can calculate appropriate process parameters or ratio in order to produce an a-C:H film of different density, absorption coefficient, or deposition rate than those discussed herein.

Table 1 summarizes a comparison of three a-C:H films deposited on three respective 300 mm circular substrates. Films 1-3 were deposited with $C_2H_2$ or $C_3H_6$ as the hydrocarbon source using one aspect of the present invention. Film 4 was deposited with $C_3H_6$ as the hydrocarbon source using a conventional, helium-based deposition process that is currently considered the standard process for the semiconductor industry.

TABLE 1

| Parameters | Film 1 | Film 2 | Film 3 | Film 4 |
|---|---|---|---|---|
| Substrate Temp. (C.) | 550 | 550 | 480 | 550 |
| Chamber Pressure (T) | 2.5 | 2.5 | 4.5 | 7 |
| HF/LF (W) | 1400 | 1400 | 1600 | 1600 |
| Electrode Spacing (mil) | 300 | 300 | 280 | 280 |
| $C_2H_2$ Flow (sccm) | 700 | 560 | 330 ($C_3H_6$) | 1800 ($C_3H_6$) |
| He Flow (sccm) | 400 | 320 | 660 | 700 |
| Argon Flow (sccm) | 14000 | 11200 | 1470 | 0 |
| Hydrogen Flow (sccm) | 1000 | 800 | 2000 | 0 |
| Dep. Rate (Å/min) | 1020 | 985 | 1190 | 2200 |
| Absorption Coefficient @ 633 nm | 0.58 | 0.60 | 0.39 | 0.40 |
| Film Density (g/cc) | 1.90 | 1.90 | 1.79 | 1.40 |

Referring to Table 1, Films 1-3 were deposited at a substantially lower pressure than Film 4 and with flow rate of hydrocarbon compound ½ that of Film 4. Particularly, Films 1-3 were deposited using a large quantity of diluent gases of argon and hydrogen. Table 1 illustrates the properties of Films 1-3 are superior to Film 4, namely, greatly improved film density. Even if compared only Films 3 and 4, which have similar processing conditions except for low pressure and the addition of a relatively large flow rate of argon and hydrogen diluents tested in Film 3, Film 3 was found to provide an increased film density. Table 1 above shows using the inventive method described herein, amorphous carbon films may be formed at a higher film density and thus having superior etch selectivity.

According to an embodiment of the present invention, one important benefit of this method is the ability to increase the film density, and therefore dry etch selectivity, of a-C:H films. It is noted that aspects of the inventive method also contemplate the use of substantially higher flow rates of argon than are necessary for the initiation of plasma in a PECVD chamber or to act as a carrier gas for a liquid-phase precursor chemical. For example, a typical flow rate of argon into a 300 mm PECVD chamber, when used as a carrier gas for a liquid-phase precursor, is on the order of about 2000 sccm or less. The flow rate of helium into such a chamber is generally even less. In contrast, the desired flow rate of argon as a diluent gas for increasing the density of an amorphous carbon film is much higher, i.e., greater than about 7000 sccm.

Figure 3:
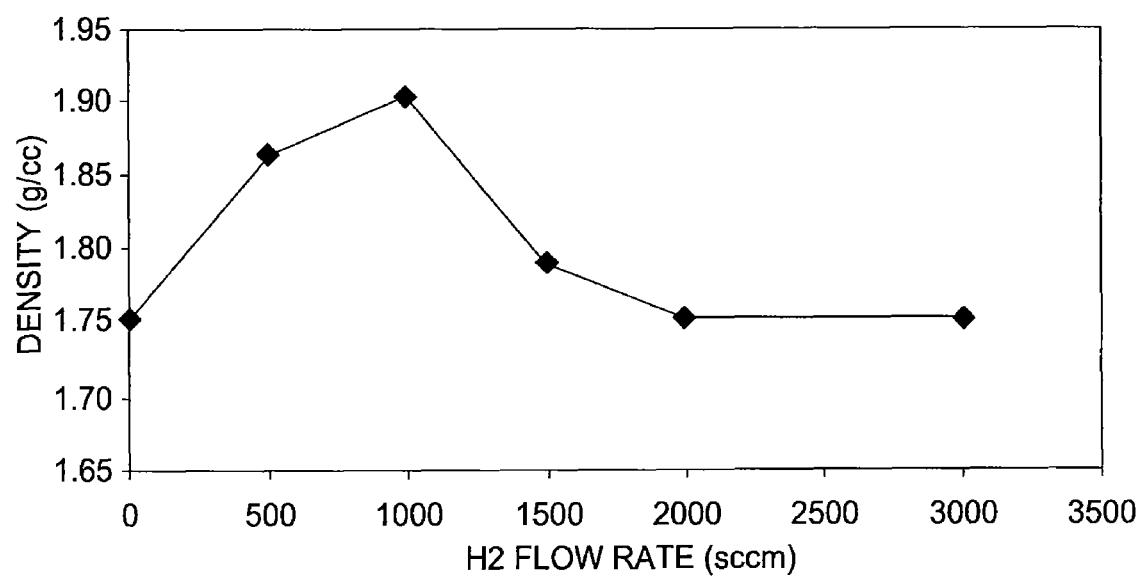
FIG. 3 is a graph demonstrating the effect of an additional hydrogen diluent gas on a-C:H film density.

It has been found that argon ions are much more effective at bombarding the surface of a substrate during film growth. Not wishing to be bound by any particular theory, the more intense bombardment of argon ions during deposition is believed to create many more dangling bonds and chemically active sites where CH-radicals in the plasma can stick to thereby form a denser film. In addition, the large flow rate of an easily ionized gas, e.g., argon, may give rise to higher plasma density and therefore, more —$CH_x$ radical creation in the gas phase. Together, the more reactive plasma and more reactive film surface associated with argon dilution lead to the beneficial combination of high deposition rate and high film density. Lighter ions, such as helium ions, are unable to produce similar results due to the lack of momentum associated with their lower mass. However, it was surprising and unexpectedly discovered that additional $H_2$ dilution can increase the film density, as explained previously in conjunction with Table 1. FIG. 3 is a graph demonstrating the effect of an additional hydrogen diluent gas on a-C:H film density. Hydrogen flow rate during deposition was increased from 0 sccm to 3000 sccm and the film density is shown to increase substantially proportionate to the higher hydrogen flow rates applied during the processing thereof. This indicates that the film density of an amorphous carbon film can be further increased by the addition of hydrogen diluent. While not holding to any particular theory, it is believed that the additional hydrogen dilution (i.e., increased use of $H_2$) decreases the deposition rate of the gas a-C:H film, which in turn allows ion bombardment from CVD plasma to be more effective in compacting the growing film, thereby providing additional densification for a-C:H films. FIG. 3 also shows that too high $H_2$ dilution (e.g., over 2000 sccm) can reduce film density instead. In addition, when the concentration of hydrogen is too high, the conformality of the deposited a:C-H film is degraded.

It has also been determined that other factors may beneficially increase deposited film density for a-C:H films to thereby increase the dry etch selectivity. These factors include, for example, decreasing the flow rate of the hydrocarbon source and reducing the processing pressure. As shown above in Table 1, it has been found that reduced chamber pressure and/or the reduction of the hydrocarbon source flow rate may also decrease the deposition rate of the a-C:H film and thereby allows ion bombardment from CVD plasma to be more effective in compacting the growing film, which in turn increases film density of a-C:H films and therefore the etch selectivity. Chamber pressure has a substantial effect on the film density because the ion energy in a plasma is directly proportional to the sheath voltage, and the sheath voltage across a substrate increases with decreasing pressure, film density is therefore expected to increase with decreasing pressure. However, film density is decreased with increasing process pressure, due to the more energetic ions found in a lower pressure plasma.

The inventive method described above allows for both a high density film and a relatively high deposition rate of a-C:H films. Compared to a standard helium-based PECVD process, the film density of a-C:H films is greatly increased from 1.40 g/cc to about 1.90 g/cc or greater, when argon and hydrogen are used as a diluent gas in large quantities. The increased density of a-C:H film results in a higher etch selectivity for hardmask films, thereby providing good line edge roughness, line width roughness, and space width roughness without line wiggling and bending issues as would normally be seen for sub 45 nm devices using conventional amorphous carbon hardmasks.

While the foregoing is directed to embodiments of the present invention, other and further embodiments of the invention may be devised without departing from the basic scope thereof, and the scope thereof is determined by the claims that follow.

The invention claimed is:

1. A method of forming an amorphous carbon layer on a substrate in a substrate processing chamber, comprising:
   introducing a hydrocarbon source into the processing chamber, wherein the hydrocarbon source comprises acetylene ($C_2H_2$);
   introducing argon, helium, hydrogen, and nitrogen into the processing chamber, wherein the molar flow rate of acetylene:helium:argon:hydrogen is in a ratio of about 1:0.5:20:1.4;
   generating a plasma in the processing chamber at a pressure of about 1 Torr to 10 Torr; and
   forming a conformal amorphous carbon layer on the substrate.

2. The method of claim 1, wherein the flow rate of argon is between about 10000 sccm and about 14000 sccm, and the flow rate of hydrogen is between about 800 sccm and about 1000 sccm.

3. The method of claim 1, wherein the amorphous carbon layer has a film density between about 1.9 g/cc and about 2.5 g/cc.

4. The method of claim 1, wherein the processing chamber has a gas distributor positioned at a distance of between about 200 mils and about 1000 mils from a substrate surface during formation of the amorphous carbon layer.

5. The method of claim 1, wherein the substrate is heated to a temperature of about 100° C. to about 480° C. during the formation of the amorphous carbon layer.

6. A method of forming a semiconductor device in a processing chamber, comprising:
   introducing a gas mixture into the processing chamber, wherein the gas mixture comprises a hydrocarbon source comprising acetylene, a plasma-initiating gas comprising helium, and a diluent gas consisting of argon and hydrogen into the processing chamber, wherein the molar flow rate of acetylene:helium:argon:hydrogen is in a ratio of about 1:0.5:20:1.4;
   generating a plasma from the gas mixture in the processing chamber to form an amorphous carbon layer on a substrate;
   defining a pattern in at least one region of the amorphous carbon layer; and
   transferring the pattern defined in the at least one region of the amorphous carbon layer into the substrate using the amorphous carbon layer as a mask.

7. The method of claim 6, wherein the plasma is generated in the processing chamber at a pressure of about 1 Torr to about 10 Torr.

8. The method of claim 6, wherein the flow rate of argon is between about 1000 sccm and about 20000 sccm, and wherein the flow rate of hydrogen is between about 500 sccm and about 5000 sccm.

9. The method of claim 6, wherein the amorphous carbon layer has a film density between about 1.9 g/cc and about 2.5 g/cc.

10. The method of claim 6, wherein the processing chamber has a gas distributor positioned at a distance between about 200 mils and about 1000 mils from a substrate surface during formation of the amorphous carbon layer.

11. The method of claim 6, wherein the substrate is heated to a temperature of about 100° C. to about 480° C. during the formation of the amorphous carbon layer.

12. The method of claim 6, wherein a single frequency RF power between about 500 Watts and about 3000 Watts is applied during formation of the amorphous carbon layer.

13. A method of forming an amorphous carbon layer on a substrate in a processing chamber, comprising:
   introducing a hydrocarbon source and a diluent gas comprising argon and hydrogen into the processing chamber, wherein the flow rate of hydrocarbon source is between about 200 sccm and about 1000 sccm, the flow rate of argon is between about 10000 sccm and about 14000 sccm, and the flow rate of hydrogen is between about 800 sccm and about 1000 sccm;
   generating a plasma from the gas mixture of the hydrocarbon source and the diluents gas in the processing chamber to form an amorphous carbon layer on a substrate; and
   introducing helium into the processing chamber, and the molar flow rate of hydrocarbon source:helium:argon:hydrogen is in a ratio of about 1:0.5:20:1.4.

* * * * *